(12) United States Patent
Kuroda et al.

(10) Patent No.: US 11,374,011 B1
(45) Date of Patent: Jun. 28, 2022

(54) METHOD OF MANUFACTURING DYNAMIC RANDOM ACCESS MEMORY

(71) Applicant: Winbond Electronics Corp., Taichung (TW)

(72) Inventors: Akira Kuroda, Taichung (TW); Hsin-Ya Wang, Taichung (TW); Chang-Han Tsai, Taichung (TW); Ming-Ting Cai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/317,886

(22) Filed: May 11, 2021

(51) Int. Cl.
*H01L 27/108* (2006.01)

(52) U.S. Cl.
CPC .... *H01L 27/10876* (2013.01); *H01L 27/1085* (2013.01); *H01L 27/10808* (2013.01); *H01L 27/10882* (2013.01)

(58) Field of Classification Search
None
See application file for complete search history.

(56) References Cited

U.S. PATENT DOCUMENTS

| 2015/0228491 | A1* | 8/2015 | Kang | H01L 29/66621 257/330 |
| 2016/0027785 | A1 | 1/2016 | Fujimoto | |
| 2017/0125532 | A1* | 5/2017 | Jang | H01L 21/02255 |

* cited by examiner

*Primary Examiner* — Anthony Ho
*Assistant Examiner* — Kevin Quinto
(74) *Attorney, Agent, or Firm* — JCIPRNET

(57) ABSTRACT

A method for manufacturing a DRAM includes: forming a hard mask layer on a substrate with an opening therein; forming a dielectric layer on a sidewall of the opening; forming a first barrier layer and a first conductor layer in the opening; performing a first dry etching and a first wet etching processes to respectively partially remove the first barrier layer and the first conductor layer, to expose the dielectric layer on upper sidewall; forming a second barrier layer in the opening; forming a mask layer in the opening to cover the second barrier layer; removing a part of the second barrier layer and the mask layer to expose the dielectric layer on the upper sidewall of the opening; and forming a second conductor layer in the opening.

20 Claims, 5 Drawing Sheets

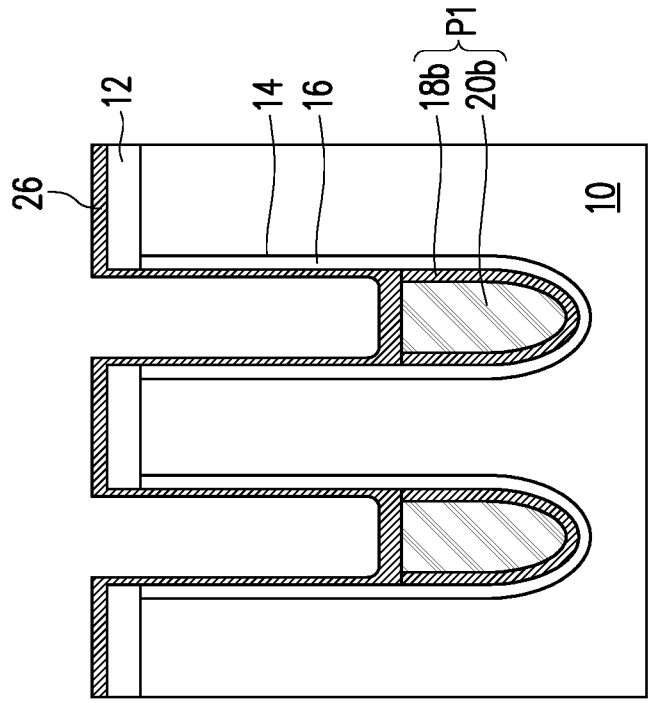
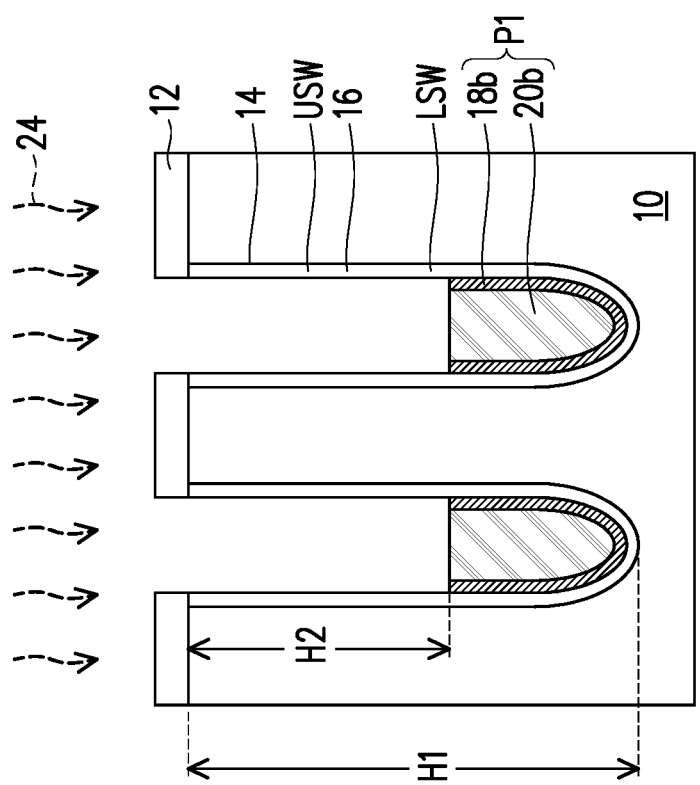
FIG. 1C
FIG. 1D

METHOD OF MANUFACTURING DYNAMIC RANDOM ACCESS MEMORY

BACKGROUND

Technical Field

The invention relates to an integrated circuit and a manufacturing method thereof, and more particularly to a dynamic random access memory and a manufacturing method thereof.

Description of Related Art

With the rapid development of science and technology, in order to meet the needs of consumers for miniaturized electronic devices, the size of the dynamic random access memory design continues to shrink and develop towards high integration. In recent years, a buried word line DRAM has been developed. In the process of embedded word line dynamic random access memory, due to the continuous reduction of component size, the process margin also becomes smaller. When forming the buried word line, if metal, barrier layer or process by-products remain on the dielectric layer on the sidewall of the buried word line trench, it will cause a problem of device reliability.

SUMMARY

The embodiment of the present invention provides a dynamic random access memory and a manufacturing method thereof, which can prevent the residual metal, barrier layer, or process by-products from remaining on the dielectric layer on the sidewall of the buried word line trench, and improve device performance reliability.

The embodiment of the present invention provides a method for manufacturing a dynamic random access memory, including: forming a hard mask layer on a substrate; forming an opening in the hard mask layer and the substrate; forming a dielectric layer on a sidewall of the opening; forming a first barrier layer and a first conductor layer in the opening; performing a first dry etching process to first partially remove the first barrier layer and the first conductor layer; performing a first wet etching process to second partially remove the first barrier layer and the first conductor layer, and expose the dielectric layer on an upper sidewall of the opening; forming a second barrier layer in the opening; forming a mask layer in the opening to cover the second barrier layer; removing a part of the second barrier layer and the mask layer to expose the dielectric layer on the upper sidewall of the opening; and forming a second conductor layer in the opening.

Based on the above, the embodiments of the present invention are described. Since the wet etching process is performed at low temperature, therefore, the dielectric layer on the upper sidewall of the word line trench can be reduced from being damaged, and the damage to the dielectric layer on the upper sidewall caused by the plasma used in the dry etching process can be avoided, and can avoid the oxidation residue (such as $WO_x$) formed by the reaction between the plasma and the conductor layer. In addition, the use of a low-temperature wet etching process is easy to control the remaining depth of the first part, which increases the uniformity of the process.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 1I are schematic cross-sectional views of a method for manufacturing a dynamic random access memory according to an embodiment of the invention.

DESCRIPTION OF THE EMBODIMENTS

Figure 1A:
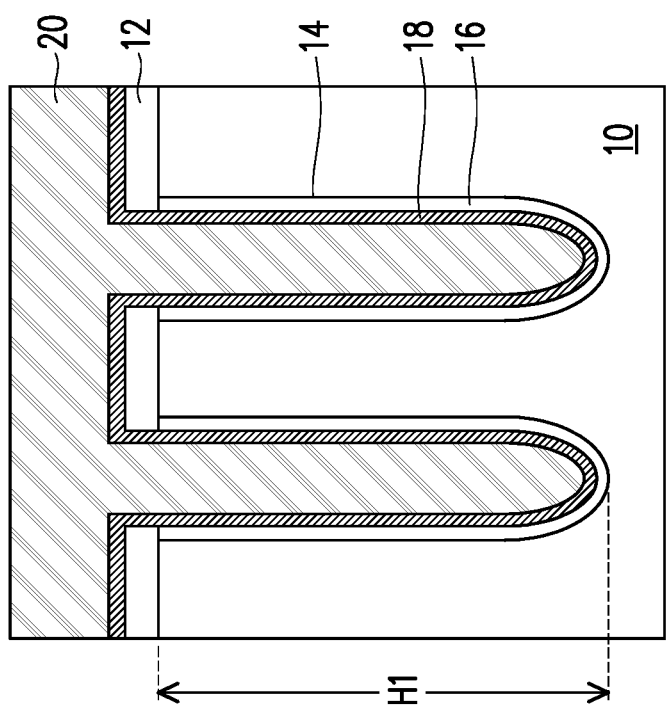

Referring to FIG. 1A, a substrate 10 is provided, such as a silicon substrate. Next, hard mask layers 12 with an opening pattern are formed on substrate 10. The method for forming hard mask layers 12 are, for example, self-aligned double patterning (SADP). The material of hard mask layers 12 is, for example, a combination of inorganic and organic films. The example of the inorganic film is, for example, silicon oxide, and the forming method is, for example, a chemical vapor deposition method or atomic layer deposition method. The example of the organic film is, for example, carbon film, and the forming method is, for example, a chemical vapor deposition method or spin coating method.

After that, using the hard mask layers 12 as masks, an etching process is performed to partially remove the substrate 10 to form an opening 14. The organic hard mask layer is removed by dry ashing process and the inorganic hard mask layer is remained on the substrate 10.

The opening 14 is, for example, a trench. In this embodiment, the buried word line trench 14 is used as an example of the opening 14 for illustration, but the invention is not limited to this. The depth H1 of the buried word line trench 14 is, for example, 110 nm to 130 nm.

Referring to FIG. 1A, a dielectric layer 16 is formed on the sidewall of the buried word line trench 14. Next, a barrier layer 18 and a conductor layer (i.e., a first conductor layer) 20 are formed on the hard mask layer 12 and in the buried word line trench 14. In detail, the barrier layer 18 is formed on the hard mask layer 12 and in the buried word line trench 14, and the conductor layer 20 is formed on the hard mask layer 12 and the barrier layer 18 in the buried word line trench 14. The dielectric layer 16 is conformally formed on the inner surface of the buried word line trench 14. The dielectric layer 16 may be an oxide layer, such as silicon oxide, and the forming method is, for example, an in-situ vapor generation technology (ISSG). The barrier layer 18 can also be referred to as an adhesion layer. The barrier layer 18 may be a single layer or multiple layers, and the material of the barrier layer 18 includes metal or metal alloy, such as titanium, titanium nitride, tantalum, tantalum nitride or a combination thereof. The material of the conductor layer 20 includes metal or metal alloy, such as tungsten.

Figure 1B:
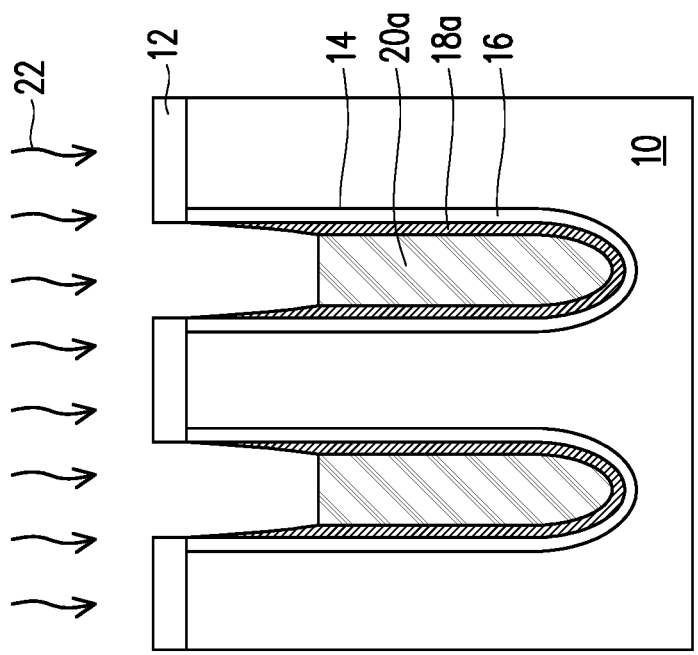

FIG. 1B and FIG. 1C illustrate a two-stage etching process to remove the barrier layer 18 and the conductor layer 20 on the hard mask layer 12, leaving the barrier layer 18b and the conductor layer 20b in the buried word line trench 14. In the embodiment of the present invention, the two-stage etching process includes a dry etching process and a wet etching process, which are described in detail as follows.

Referring to FIG. 1B, the first stage of the etching process 22 is performed. The first stage of the etching process 22 is a dry etching process to remove the barrier layer 18 and the conductor layer 20 on the hard mask layer 12, leaving the barrier layer 18a and the conductor layer 20a in the buried word line trench 14. The dry etching process is, for example, a reactive ion etching process.

Referring to FIG. 1C, the second stage etching process 24 is performed. The second stage etching process 24 is a wet etching process, to partially remove the barrier layer 18a and the conductor layer 20a, so that the remaining barrier layer 18b and the conductor layer 20b are located on the lower sidewall LSW and the bottom of the buried word line trench 14, exposing the dielectric layer 16 on the upper sidewall USW of the buried word line trench 14. The etchant used in the wet etching process is, for example, an aqueous solution of sulfuric acid and hydrogen peroxide. The volume ratio of sulfuric acid to hydrogen peroxide is, for example, 6:1. The wet etching process is performed at a low temperature. The temperature of the etchant is lower than 60° C., for example. In one embodiment, the temperature of the etchant is 40-50° C. The depth H2 of the remaining conductor layer 20b is, for example, about ¼ to ⅓ of the depth H1 of the buried word line trench 14. In some embodiments, the depth H2 of the remaining conductor layer 20b is, for example, between 60 nm and 70 nm. The conductor layer 20b and the barrier layer 18b are located below the buried word line trench 14 as the first part P1 of the buried word line.

The wet etching process 24 can prevent the barrier layer 18a from remaining on the dielectric layer 16 on the upper sidewall USW of the buried word line trench 14. Moreover, since the wet etching process is performed at low temperature, therefore, the dielectric layer 16 on the upper sidewall USW of the buried word line trench 14 can be reduced from being damaged, to avoid damage to the dielectric layer 16 of the upper sidewall USW caused by the plasma used in the dry etching process, in addition, oxidation residues (such as $WO_x$) formed by the reaction between the plasma and the conductor layer 20b can be avoided. In addition, it is easy to control the depth of the remaining conductor layer 20b and barrier layer 18b by using a low-temperature wet etching process, thereby increasing the uniformity of the process.

Referring to FIG. 1D, a barrier layer (i.e., a second barrier layer) 26 is formed on the substrate 10. Namely, the barrier layer 26 is formed on the sidewall and the bottom of the buried word line trench 14, and the remaining conductor 20b and the remaining barrier layer 18b are covered by the barrier layer 26. The barrier layer 26 can be a single layer or multiple layers, and the material of the barrier layer 26 includes metal or metal alloy, such as titanium, titanium nitride, tantalum, tantalum nitride, or a combination thereof. The barrier layer 26 may be formed by a physical vapor deposition method, such as a sputtering method. The thickness of the barrier layer 26 is, for example, 2 nm to 3 nm.

Figure 1F:
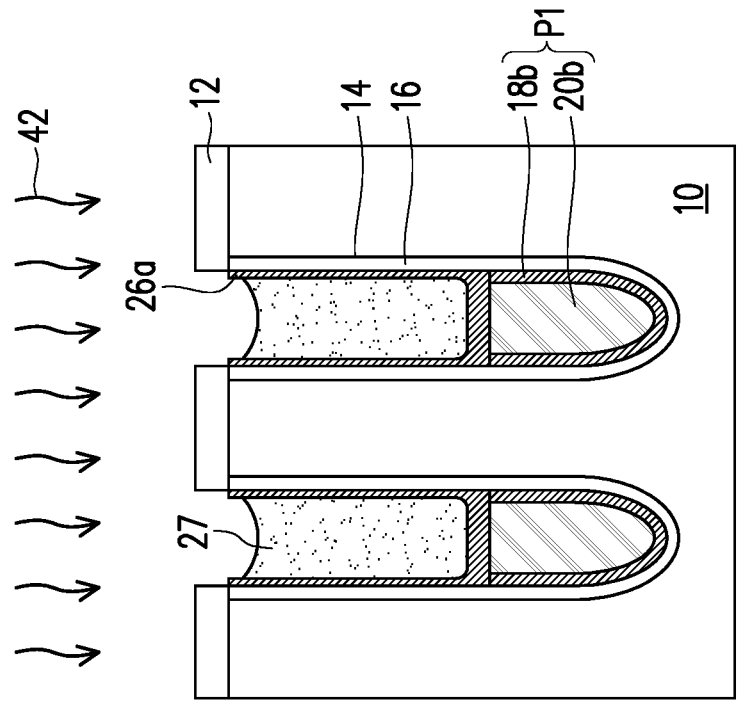
Figure 1E:
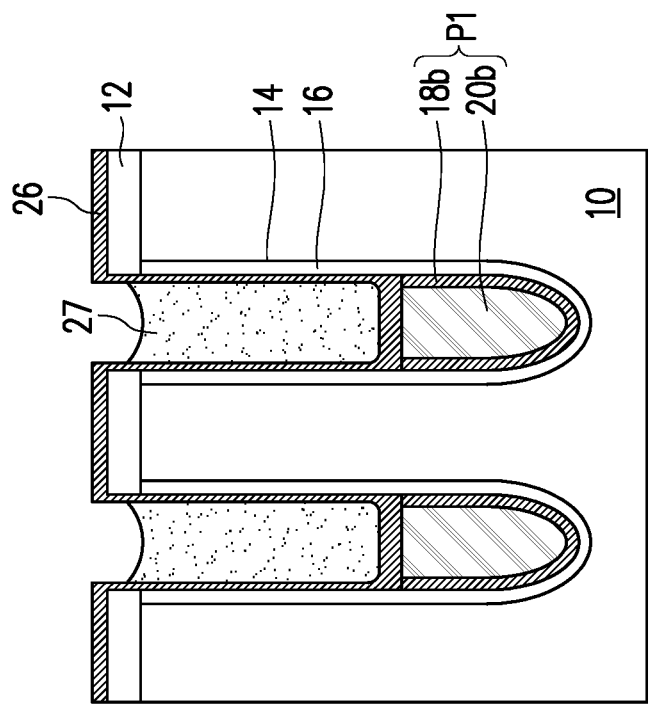

Referring to FIG. 1E, a mask layer 27 is formed on the barrier layer 26 in the buried word line trench 14. The mask layer 27 is formed in the buried word line trench 14, so that the sidewall of second barrier layer 26 buried word line trench 14 may be covered. The mask layer 27 is, for example, a bottom anti-reflection layer (BARC). The method for forming the mask layer 27 is, for example, spin coating.

Figure 1G:
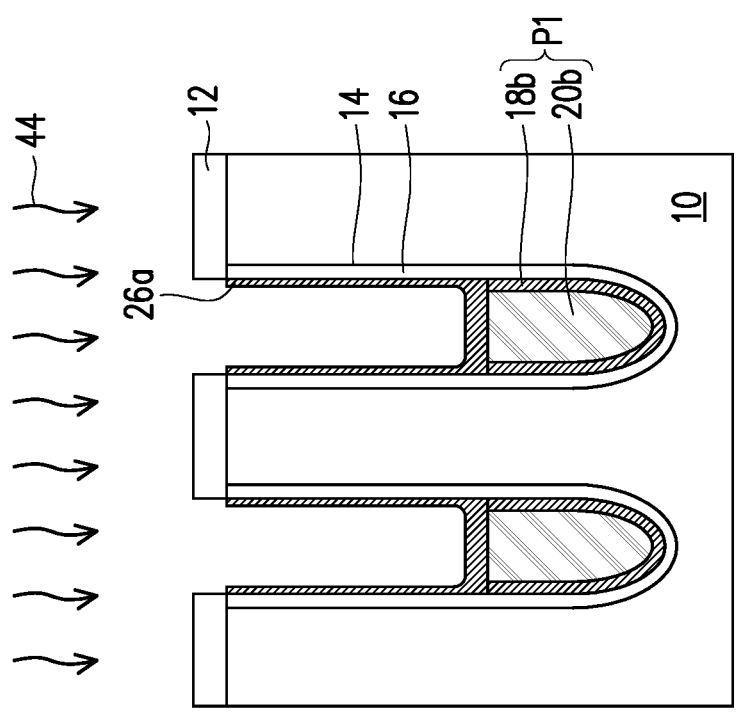
Figure 1H:
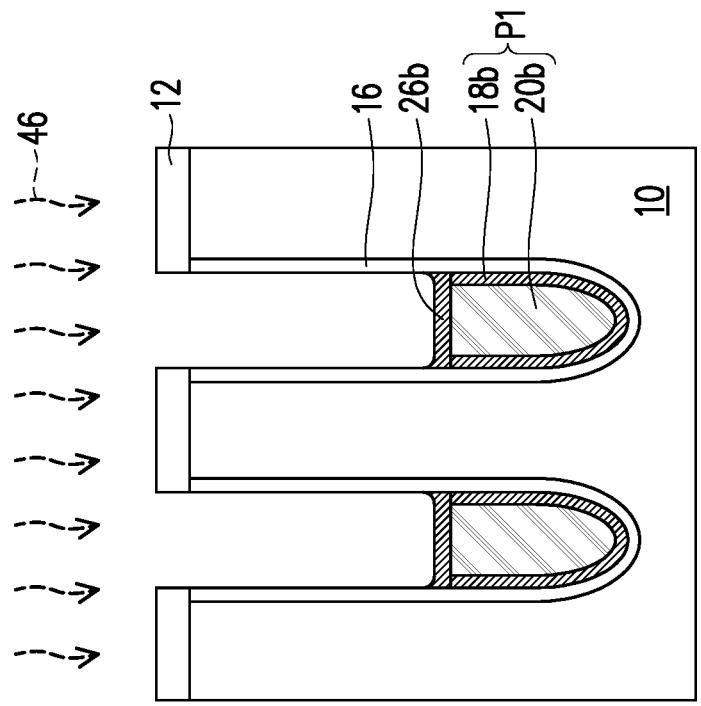
Figure 11:
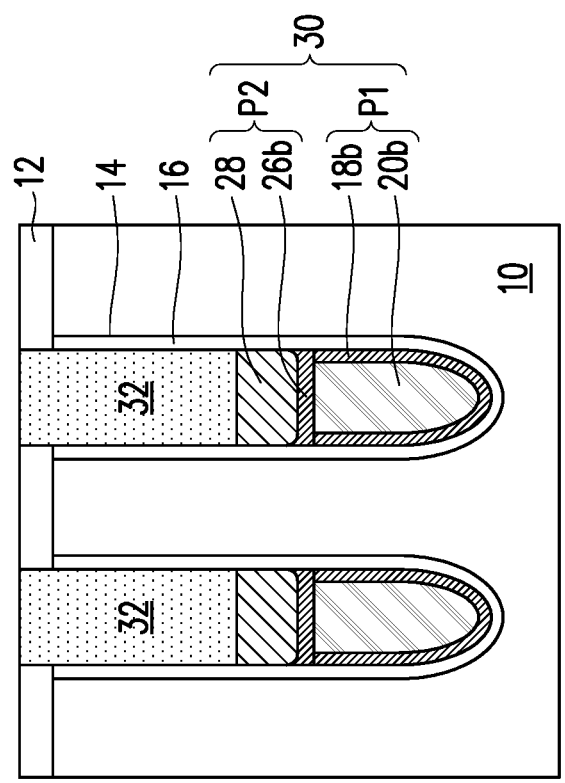

FIG. 1F to FIG. 1H show a three-stage process to remove part of the barrier layer 26 and the mask layer 27, leaving the barrier layer 26b in the buried word line trench 14. In the embodiment of the present invention, the three-stage etching process includes two dry etching processes and a wet etching process, which are described in detail as follows.

Referring to FIG. 1F, using the mask layer 27 as a mask, the first stage process 42 is performed. The first stage process 42 is a dry etching process to remove the barrier layer 26 on the hard mask layer 12 and leave the barrier layer 26a in the buried word line trench 14. The dry etching process is, for example, a reactive ion etching process.

Referring to FIG. 1G, the second stage process 44 is performed. The second stage process 44 is a dry ashing process to remove the mask layer 27 and expose the barrier layer 26a. The second stage process and the first stage process can be performed in the same reactive ion etching machine. The barrier layer 26a covers the dielectric layer 16 on the upper sidewall USW of the buried word line trench 14 and covers the conductor layer 20b and barrier layer 18b on the lower sidewall USW and the bottom of the buried word line trench 14.

Referring to FIG. 1H, the third stage process 46 is performed. The third stage process 46 is a wet etching process to partially remove the barrier layer 26a, so that the remaining barrier layer 26b covers the conductor layer 20b and barrier layer 18b on the lower sidewall USW and the bottom of the buried word line trench 14, and the dielectric layer 16 on the upper sidewall USW of the buried word line trench 14 is exposed. The etchant used in the wet etching process is, for example, an aqueous solution of sulfuric acid and hydrogen peroxide. The volume ratio of sulfuric acid to hydrogen peroxide is, for example, 14:1. The wet etching process is performed at a low temperature. The temperature of the etchant is lower than 60° C., for example. In one embodiment, the temperature of the etchant is 40-50° C.

The wet etching process 46 can prevent the barrier layer 26a from remaining on the dielectric layer 16 on the upper sidewall USW of the buried word line trench 14. Moreover, since the wet etching process is performed at a low temperature, the dielectric layer 16 on the upper sidewall USW of the buried word line trench 14 can be reduced from being damaged, and the loss of the conductor layer 20b can be reduced.

Referring to FIG. 1I, a conductor layer (i.e., a second conductor layer) 28 is formed in the buried word line trench 14. The material of the conductor layer 28 is different from that of the conductor layer 20. In some embodiments, the conductor layer 20 is a metal or a metal alloy and the conductor layer 28 is doped polysilicon. The bottom surface of the conductor layer 28 covers and contacts the barrier layer 26b, and the sidewall of the conductor layer 28 is in contact with the dielectric layer 16. The conductor layer 28 can be formed by depositing and etching back a doped polysilicon layer. The thickness of the conductor layer 28 is, for example, 10 nm to 20 nm. The conductor layer 28 and the barrier layer 26b, the barrier layer 18b and the conductor layer 20b form a buried word line 30. The barrier layer 18b and the conductor layer 20b jointly serve as the first part P1 of the buried word line 30; the conductor layer 28 and the barrier layer 26b jointly serve as the second part P2 of the buried word line 30. The resistance value of the conductor layer 20b of the first part P1 is lower than that of the conductor layer 28, and the conductor layer 20b is separated from the dielectric layer 16 by the barrier layer 18b. The conductor layer 28 of the second part P2 is in contact with the dielectric layer 16, and is separated from the conductor layer 20b by the barrier layer 26b.

Referring to FIG. 1I, an insulating layer 32 is formed in the buried word line trench 14. The material of the insulating layer 32 is silicon nitride, for example. The insulating layer 32 is formed by, for example, depositing and etching back an insulating material layer.

In summary, the present invention adopts a wet etching process in the process of forming the buried word line to avoid the barrier layer remaining on the dielectric layer on the upper sidewall of the word line trench. Moreover, since the wet etching process is performed at low temperature, therefore, the dielectric layer on the upper sidewall of the word line trench can be reduced from being damaged, and the damage to the dielectric layer on the upper sidewall caused by the plasma used in the dry etching process can be avoided, and can avoid the oxidation residue (such as $WO_x$) formed by the reaction between the plasma and the conductor layer. In addition, the use of a low-temperature wet etching process is easy to control the remaining depth of the first part, which increases the uniformity of the process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for manufacturing a dynamic random access memory (DRAM), comprising:
    forming a hard mask layer on a substrate;
    forming an opening in the hard mask layer and the substrate;
    forming a dielectric layer on a sidewall of the opening;
    forming a first barrier layer and a first conductor layer in the opening;
    performing a first dry etching process to first partially remove the first barrier layer and the first conductor layer;
    performing a first wet etching process to second partially remove the first barrier layer and the first conductor layer, and expose the dielectric layer on an upper sidewall of the opening;
    forming a second barrier layer in the opening;
    forming a mask layer in the opening to cover the second barrier layer;
    removing a part of the second barrier layer and the mask layer to expose the dielectric layer on the upper sidewall of the opening; and
    forming a second conductor layer in the opening.

2. The method for manufacturing a dynamic random access memory according to claim 1, wherein the first dry etching process includes a reactive ion etching process.

3. The method for manufacturing a dynamic random access memory according to claim 1, further comprising filling the opening with an insulating layer to cover the second conductor layer.

4. The method for manufacturing a dynamic random access memory according to claim 1, wherein a method for forming the hard mask layers comprises self-aligned double patterning (SADP).

5. The method for manufacturing a dynamic random access memory according to claim 1, wherein a thickness of the second conductor layer is 10 nm to 20 nm.

6. The method for manufacturing a dynamic random access memory according to claim 1, wherein a remaining first barrier layer and a remaining first conductor layer are located on a lower sidewall and a bottom of the opening after performing the first wet etching process.

7. The method for manufacturing a dynamic random access memory according to claim 6, wherein a depth of the remaining first conductor layer is ¼ to ⅓ of a depth of the opening.

8. The method for manufacturing a dynamic random access memory according to claim 1, wherein a temperature of an etchant used in the first wet etching process is below 60° C.

9. The method for manufacturing a dynamic random access memory according to claim 8, wherein the temperature of the etchant used in the first wet etching process is 40-50° C.

10. The method for manufacturing a dynamic random access memory according to claim 1, wherein an etchant used in the first wet etching process includes an aqueous solution of sulfuric acid and hydrogen peroxide.

11. The method for manufacturing a dynamic random access memory according to claim 10, wherein a volume ratio of the sulfuric acid to the hydrogen peroxide is 6:1.

12. The method for manufacturing a dynamic random access memory according to claim 1, wherein a material of the hard mask layers is a combination of inorganic and organic films.

13. The method for manufacturing a dynamic random access memory according to claim 12, wherein the inorganic film is silicon oxide and the organic film is carbon film.

14. The method for manufacturing a dynamic random access memory according to claim 1, wherein removing a part of the second barrier layer and the mask layer further comprises:
    performing a second dry etching process to first partially remove the second barrier layer;
    removing the mask layer; and
    performing a second wet etching process to expose the dielectric layer on the upper sidewall of the opening by second partially removing the second barrier layer.

15. The method for manufacturing a dynamic random access memory according to claim 14, wherein a temperature of an etchant used in the second wet etching process is below 60° C.

16. The method for manufacturing a dynamic random access memory according to claim 15, wherein the temperature of the etchant used in the second wet etching process is 40-50° C.

17. The method for manufacturing a dynamic random access memory according to claim 14, wherein an etchant used in the second wet etching process includes an aqueous solution of sulfuric acid and hydrogen peroxide.

18. The method for manufacturing a dynamic random access memory according to claim 17, wherein a volume ratio of the sulfuric acid to the hydrogen peroxide is 14:1.

19. The method for manufacturing a dynamic random access memory according to claim 14, wherein the second dry etching process includes a reactive ion etching process.

20. The method for manufacturing a dynamic random access memory according to claim 14, wherein the second dry etching process and the removing of the mask layer are performed in the same machine.

* * * * *